(12) United States Patent
Sander

(10) Patent No.: US 8,829,973 B2
(45) Date of Patent: Sep. 9, 2014

(54) SWITCH MODE CIRCULATOR ISOLATED RF MIXER

(75) Inventor: Sverker Sander, Billdal (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 13/877,896

(22) PCT Filed: Oct. 4, 2010

(86) PCT No.: PCT/EP2010/064753
§ 371 (c)(1),
(2), (4) Date: Apr. 4, 2013

(87) PCT Pub. No.: WO2012/045330
PCT Pub. Date: Apr. 12, 2012

(65) Prior Publication Data
US 2013/0194022 A1 Aug. 1, 2013

(51) Int. Cl.
*H04B 1/44* (2006.01)
(52) U.S. Cl.
USPC .......................... 327/355; 455/323; 333/250
(58) Field of Classification Search
USPC ............. 327/355–361; 331/25, 135; 455/323, 455/326; 333/250, 33
See application file for complete search history.

(56) References Cited

U.S. PATENT DOCUMENTS

| | | | |
|---|---|---|---|
| 4,329,688 A * | 5/1982 | Goldie | 342/168 |
| 5,345,239 A | 9/1994 | Madni et al. | |
| 5,496,755 A * | 3/1996 | Bayraktaroglu | 438/167 |
| 5,606,738 A | 2/1997 | Onodera et al. | |
| 6,573,808 B1 * | 6/2003 | Burin | 333/132 |
| 7,164,902 B2 * | 1/2007 | Yamada et al. | 455/326 |
| 7,181,243 B1 | 2/2007 | Nicholls et al. | |

FOREIGN PATENT DOCUMENTS

| | | |
|---|---|---|
| FR | 2552270 A1 | 3/1985 |
| JP | 57112108 A | 7/1982 |

OTHER PUBLICATIONS

Zirath, A Subharmonically Pumped Resistive Duel-HEMT-Mixer, Department of Applied Electron Physics, Chalmers University of Technology Göteborg, Sweden; 1991 IEEE MTT-S Digest, pp. 875-878.

\* cited by examiner

*Primary Examiner* — Dinh T. Le
(74) *Attorney, Agent, or Firm* — Rothwell, Figg, Ernst & Manbeck, P.C.

(57) ABSTRACT

A radio frequency mixer circuit comprises a first terminal, a local oscillator terminal and a second terminal, a wave propagation medium having a first and second end, a circulator coupling together the first terminal, the first end of the wave propagation medium and the second terminal, a switching means operable according to a signal coupled to the LO terminal, the switching means being coupled to the second end of the wave propagation medium for causing a reflection with unchanged voltage wave polarity when the switching means is in an open state, or a reflection with inverted voltage wave polarity when the switching means is in a closed state, at the second end of the wave propagation medium when a wave is travelling therein.

17 Claims, 5 Drawing Sheets

US 8,829,973 B2

SWITCH MODE CIRCULATOR ISOLATED RF MIXER

CROSS REFERENCE TO RELATED APPLICATION(S)

This application is a 35 U.S.C. §371 National Phase Entry Application from PCT/EP2010/064753, filed Oct 4, 2010, designating the United States, the disclosure of which is incorporated herein in its entirety by reference.

TECHNICAL FIELD

The present invention relates to mixer circuits.

BACKGROUND

Mixer circuits are widely employed in radio frequency (hereinafter referred to as RF) communication systems. The expression 'radio frequency' is used in this specification to designate wireless communication frequencies without any specific upper limit and embodiments of this invention are usable up to millimeter wavelength frequencies and beyond. Generally speaking, mixers perform frequency translation by multiplying two signals and possibly their harmonics.

RF mixers are for instance used to convert applied RF signals to intermediate frequency (hereinafter referred to as IF) signals at the input section of an RF spectrum analyzer. Low mixer distortion and high isolation between local oscillator (hereinafter referred to as LO) signals applied to the mixer and the IF signals produced by the mixer enable an RF spectrum analyzer to accurately represent the spectral content of applied RF signals. Mixers are used to either translate or convert the frequency up, for instance when mixing an IF signal with a LO signal to produce a suitable RF signal for transmission or to translate or convert the frequency down, for instance when a received RF signal is mixed with a LO signal to produce a suitable IF signal.

RF mixers used today in the RF spectrum uses two or more mixing diodes to achieve the desired mixing with low distortion, producing complicated mechanical assemblies and unnecessary us of costly components.

U.S. Pat. No. 5,790,945 describes a dumbbell shaped resonator coupling IF signals from short transmission lines to an output transmission line at a RF mixer's IF output port. The RF mixer uses two diodes to perform the mixing of the RF and LO signals.

The use of multiple diodes generates complicated and unnecessarily expensive circuits. The diodes have a forward voltage drop when they are conducting, causing unwanted power dissipation. The forward voltage drop also limits the mixer's power handling capability.

SUMMARY

It is an object of the invention among others to set forward a cost effective mixer circuit.

According to the invention, a radio frequency mixer circuit is provided. The mixer circuit comprises a first terminal, a LO terminal and a second terminal; a wave propagation medium having a first and second end. The mixer circuit further comprises a circulator coupling together the first terminal, the first end of the wave propagation medium and the second terminal; a switching means operable according to a signal coupled to the LO terminal. The switching means is coupled to the second end of the wave propagation medium for causing a reflection with unchanged voltage wave polarity when the switching means is in an open state, or a reflection with inverted voltage wave polarity when the switching means is in a closed state, at the second end of the wave propagation medium when a wave is travelling therein.

According to a further aspect of the invention the radio frequency mixer circuit may further comprise one or several wave propagation medium with a first and second end, where the first end of the further wave propagation medium is coupled to the circulator. The mixer circuit may further also comprise one or several switching means and a further LO terminal where the further switching means is operable according to a signal coupled to the further LO terminal. The further switching means is also coupled to the second end of the wave propagation medium for causing a reflection with unchanged voltage wave polarity when the switching means is in an open state, or a reflection with inverted voltage wave polarity when the switching means is in a closed state, at the second end of the wave propagation medium when a wave is travelling therein. The further wave propagation medium and the further switching means enables frequency conversion to be performed in two steps utilizing one common circulator.

According to an aspect of the invention, there is carried out a mixing of signals by reflection of signals in a switching means due to high or low impedance based on the state of the switching means. Since the switching means is either fully turned on (typically drain-source resistance 1 mΩ) or fully turned off (typically drain-source resistance 1 MΩ), the conducting losses in the semiconductor will be very low, thus not having the drawbacks of large forward voltage drop as if diodes were used.

The present invention may further enable frequency conversion of IF or RF signals having extremely large power levels (W or kW). Different transmitter system architecture may consequently be designed, by locating the main power amplifier (PA) prior to frequency up-conversion (as opposite to after frequency up-conversion in common transmitter systems), for performing amplification at IF frequencies, thus relaxing the power amplifier requirements. In the same manner may different receiver system architecture be designed by locating attenuators or automatic gain control (AGC) circuits after frequency down-conversion (as opposite to before frequency down-conversion in common receiver systems).

The second end of the wave propagation medium may be coupled to ground when the switching means is in a closed state or may be coupled to a DC voltage source when the switching means is in a closed state.

The second end of the wave propagation medium is isolated from ground when the switching means is in an open state.

The switching means advantageously comprises a single semiconductor switch coupled to the wave propagation medium which gives the benefit of reducing the number of components while still maintaining the desired functionality of the mixer circuit. The need for fewer components also makes the mixer circuit more inexpensive and easier to construct and manufacture.

The first terminal of the mixer circuit may be an input terminal for coupling an IF signal and the second terminal of the mixer circuit may be an output terminal for coupling a RF signal. Alternatively, the first terminal may be an input terminal for coupling a RF signal and the second terminal may be an output terminal for coupling an IF signal.

The radio frequency mixer circuit may be operable for up-converting a signal coupled to the first terminal by modulating the signal coupled to first terminal with the signal coupled to the LO terminal, where the frequency of the signal coupled to the LO terminal is higher than the frequency of the signal coupled to the first terminal.

The radio frequency mixer circuit may be operable for down-converting a signal coupled to the first terminal by modulating the signal coupled to the first terminal with the signal coupled to the LO terminal, where the frequency of the signal coupled to the LO terminal is lower than the frequency of the signal coupled to the first terminal.

The signal coupled to the first terminal may be routed in the circulator to the first end of the wave propagation medium and the signal resulting from the reflection in the second end of the wave propagation medium may be routed in the circulator to the second terminal.

The signal coupled to the first terminal may be routed in the circulator to the first end of the wave propagation medium, the signal resulting from the reflection in the second end of the wave propagation medium may be routed to the first end of a second wave propagation medium and the signal resulting from the reflection in the second end of the second wave propagation medium is routed in the circulator to the second terminal.

The switching means may comprise a semiconductor switch, being one of Metal-oxide-semiconductor field-effect transistor (herein after called MOSFET), complementary metal-oxide-semiconductor (herein after called CMOS), gallium arsenide (herein after called GaAs) or silicon-germanium (herein after called SiGe). Any other kind of switching means suitable for similar operation is of course possible.

The wave propagation medium may comprise at least one of a transmission line, a micro strip, a strip line, a printed circuit board track, a cable, lumped LC elements or a waveguide.

The circulator through which the electrical power travels, is preferably made up by one of a magnetized material, a conductor near a magnetized material, a waveguide near a magnetized material, or made up by electrical switches or other semiconductors to emulate corresponding circulator function. Other types of circulators are also possible.

The mixer circuit contains an electrical termination for each wave propagation medium.

The electrical length of the respective wave propagation medium corresponds substantially to $\lambda_1$ or longer, where $\lambda_1$ is the wavelength of the signal into the respective first end of the wave propagation medium.

Although the invention mainly aims at converting signals from or into the RF spectrum, i.e. frequencies from 30 kHz to 300 GHz, it is feasible to use the mixer circuit for arbitrary frequencies, as long as the wavelength of the input signal to the first terminal is roughly the same or shorter than the electrical length of the wave propagation medium.

Further details, aspects and embodiments of the invention will be described, by way of example only, with reference to the drawings. Elements in the figures are illustrated for simplicity and clarity and have not necessarily been drawn to scale.

DETAILED DESCRIPTION

The present invention describes a mixer circuit capable of converting applied RF or IF signals. The conversion can be made either from a lower frequency to a higher frequency (up-conversion) or from a higher frequency to a lower frequency (down-conversion).

Figure 1:
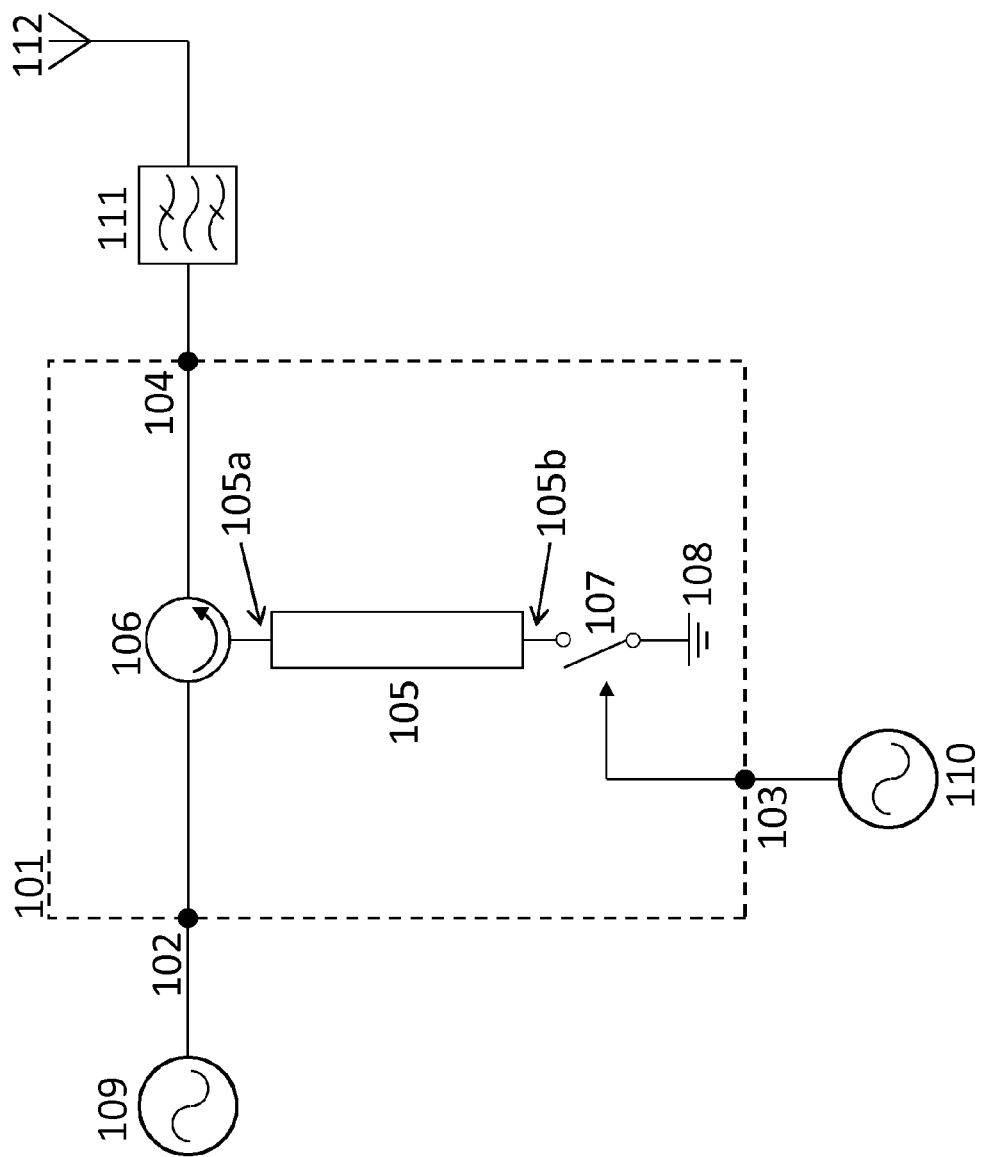
FIG. 1 is an illustration of a first embodiment of a mixer circuit according to the invention.

FIG. 1 schematically illustrates a first aspect of the invention where the mixer circuit 101 is used for up-converting an IF signal by modulating it with a LO signal with a frequency higher than the IF signal. The resulting signal is a RF signal suitable for transmission by an antenna.

The mixer circuit 101 comprises a first terminal 102, a LO terminal 103 and a second terminal 104. The mixer circuit further comprises a wave propagation medium 105 having a first and second end 105a and 105b, a circulator 106, and a switching means 107.

The terminals used are any terminals suited for coupling signals from peripheral equipment such as signal generators, filters, antennas, analogue-to-digital converters and other suitable equipment to a terminal. All terminals may be of the same kind or of different kinds depending on the characteristics of the signal coupled to each of the terminals.

Circulators (and isolators) are passive devices used in modern RF and microwave equipment since some decades. The circulator is defined as a passive device with 3 or more ports, where power is transferred from one port to the next in a prescribed order. For a 3-port-circulator the following applies: power entering port 1 leaves port 2, port 3 is decoupled; power entering port 2 leaves port 3, port 1 is decoupled; and power entering port 3 leaves port 1, port 2 is decoupled. For a 4-port-circulator it is similar: power entering port 1 leaves port 2, port 3 and 4 are decoupled, power entering port 2 leaves port 3, port 4 and 1 are decoupled, power entering port 3 leaves port 4, port 1 and 2 are decoupled and power entering port 4 leaves port 1, port 2 and 3 are decoupled.

A circulator may be made up by one of a magnetized material, a conductor near a magnetized material, a waveguide near a magnetized material, or made up by electrical switches or other semiconductors to emulate corresponding circulator function. The circulator may also be integrated into a strip line circuit.

A wave propagation medium may comprise at least one of a transmission line, a micro strip, a strip line, a printed circuit board track, a cable, lumped LC elements or a waveguide. The electrical length of the wave propagation medium corresponds substantially to $\lambda_1$ or longer, where $\lambda_1$ is the wavelength of the signal into the first end of the wave propagation medium.

The circulator 106 couples together the first terminal 102, the first end 105a of the wave propagation medium 105 and the second terminal 104. The switching means 107 is connected to the LO terminal 103 and is operable to open and close according to the voltage and/or the polarity of a signal coupled to the LO terminal 103 Depending on the type of switching means chosen, the threshold voltage and polarity required to open and close the switching means may be varied. The signal coupled to the LO terminal 103 is generated by a LO generator 110, preferably producing either a sine wave or a square wave originating from a crystal oscillator (XO) or a phase locked loop (PLL). Alternative suitable wave forms are of course also possible signals. The switching means 107 is further coupled to the second end 105b of the wave propagation medium 105 and to an electrical termination 108. The electrical termination 108 may be printed circuit board (PCB) vertical interconnect accesses (hereinafter referred to as vias) coupled to a ground plane or other low impedance component coupled to the system's ground or alternatively to a DC voltage source (not shown).

In FIG. 1, the first terminal 102 is coupled to an IF generator, that may be a digital to analogue converter (DAC), an amplifier or both, and the second terminal 104 is coupled to a filter 111 for rejecting unwanted frequencies. The filter 111 may be any suitable microwave filter known in the art, for instance low-pass, high-pass or band-pass. The filter 111 is then connected to an antenna 112 suitable for transmitting the desired output RF signal.

The IF signal coupled to the first terminal 102 is routed in the circulator 106 to the first end 105a of the wave propagation medium 105. The resulting RF signal from the reflection in the second end 105b of the wave propagation medium 105 is then routed in the circulator 106 to the second terminal 104.

The switching means preferably consists of a single switch coupled to the wave propagation medium 105. The single switch may be a semiconductor switch, for instance MOSFET, CMOS, GaAs or SiGe but may also be any other switch suitable for operation in the preferred frequency range.

Figure 2:
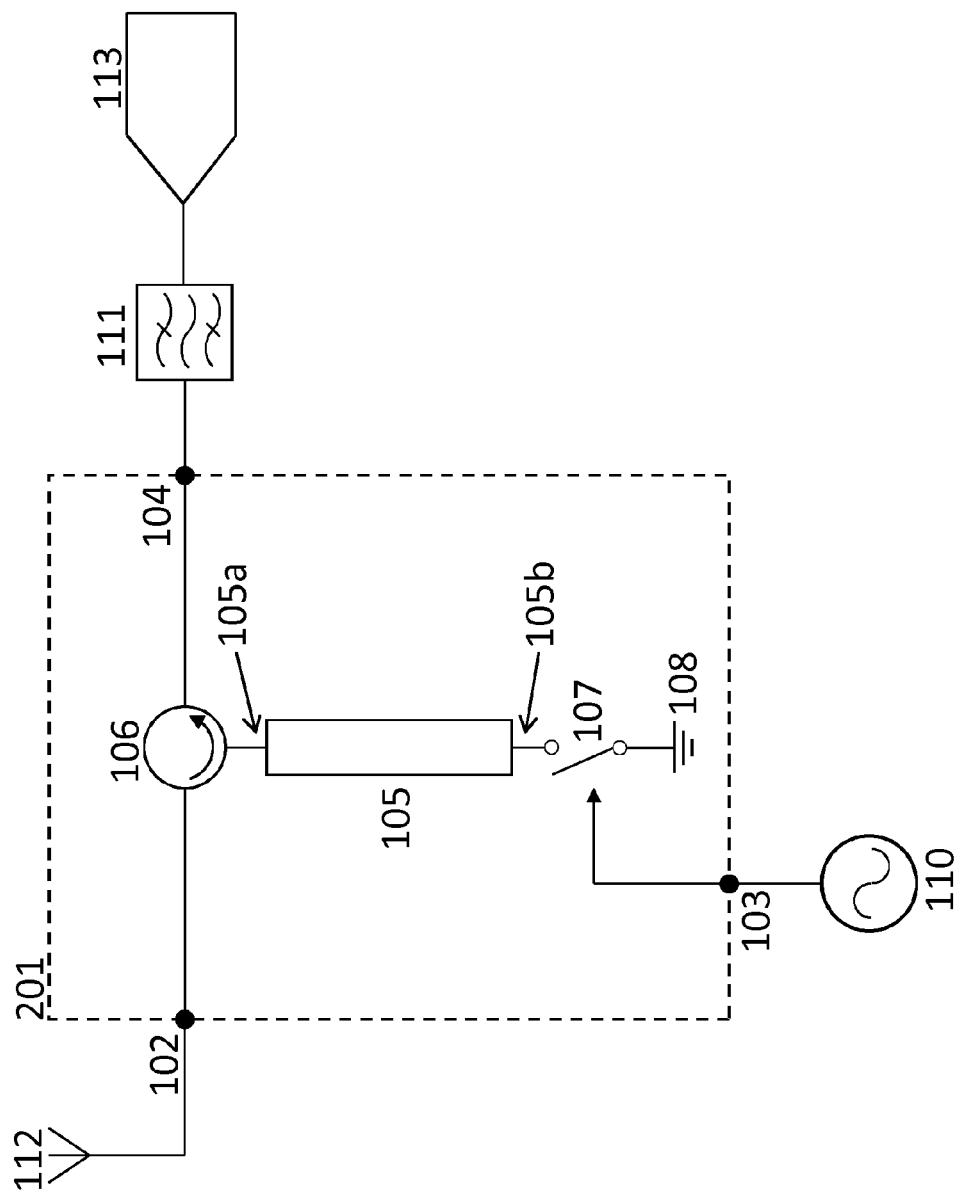
FIG. 2 is an illustration of a second embodiment of a mixer circuit according to the invention.

FIG. 2 schematically illustrates a second aspect of the invention where the mixer circuit 201 is used for down-converting a RF signal by modulating it with a LO signal with a frequency lower than the RF signal. The resulting signal is an IF signal suitable for processing by a receiver system in the digital domain after analogue to digital conversion.

The mixer circuit 201 comprises a first terminal 102, a LO terminal 103 and a second terminal 104. The mixer circuit further comprises a wave propagation medium 105 having a first and second end 105a and 105b, a circulator 106, a switching means 107.

The properties of the wave propagation medium 105, the circulator 106 and the switching means 107 are the same as referred to in the description of FIG. 1.

The circulator 106 couples together the first terminal 102, the first end 105a of the wave propagation medium 105 and the second terminal 104. The switching means 107 is connected to the LO terminal 103 and is operable to open and close according to the voltage and/or the polarity of a signal coupled to the LO terminal 103. The signal coupled to the LO terminal 103 is generated by a LO generator 110, preferably producing either a sine wave or a square wave. Alternative suitable wave forms are of course also possible signals. The switching means 107 is further coupled to the second end 105b of the wave propagation medium 105 and to an electrical termination 108.

The electrical termination 108 may be printed circuit board (PCB) vias coupled to a ground plane or other low impedance component coupled to the system's ground or alternatively to a DC voltage source (not shown).

In FIG. 2 the first terminal 102 is coupled to an antenna 112 for receiving RF signals. A filter (not shown) may be placed between the antenna 112 and the first terminal 102 for rejecting unwanted frequencies of the RF signal. The second terminal 104 is coupled to a filter 111 for rejecting unwanted frequencies. The filter 111 may be any suitable filter known in the art, for instance low-pass, high-pass or band-pass. The filter 111 is then connected to an analogue-to-digital converter 113 converting the analogue signal into a digital signal for further processing by the receiver system in the digital domain.

The RF signal coupled to the first terminal 102 is routed in the circulator 106 to the first end 105a of the wave propagation medium 105. The resulting IF signal from the reflection in the second end 105b of the wave propagation medium 105 is then routed in the circulator 106 to the second terminal 104.

The switching means preferably consists of a single switch coupled to the wave propagation medium 105. The single switch may be a semiconductor switch, for instance MOSFET, CMOS, GaAs or SiGe but may also be any other switch suitable for operation in the preferred frequency range.

Figure 3:
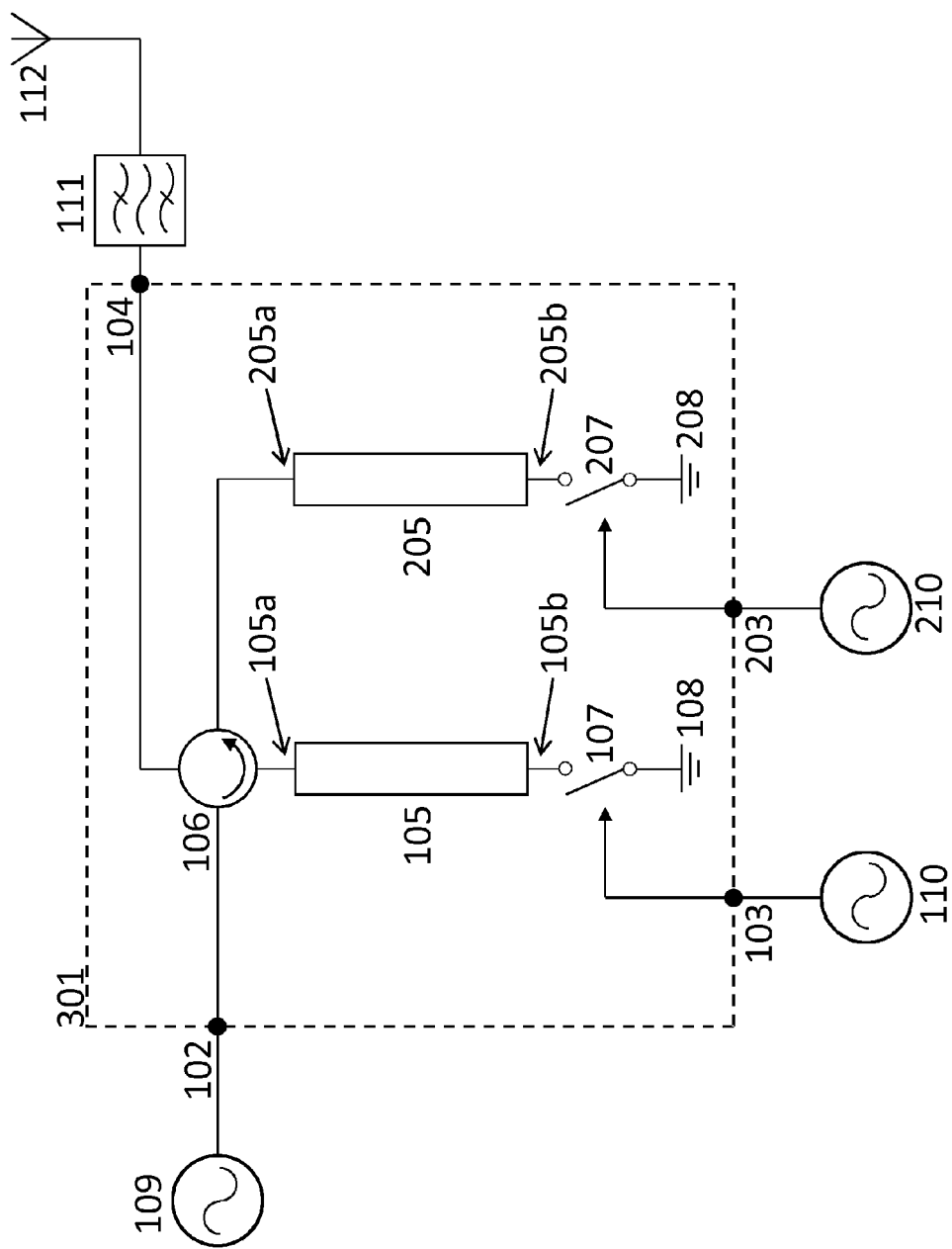
FIG. 3 is an illustration of a third embodiment of a mixer circuit according to the invention.

FIG. 3 schematically illustrates a mixer circuit 301 with an additional LO terminal 203, an additional wave propagation medium 205 and an additional switching means 207 compared to the mixer circuit 101. The function of the mixer circuit 301 is the same as the mixer circuit 101 shown in FIG. 1, i.e. it is used for up-converting an IF signal by modulating it with LO signals coupled to the LO terminals 103, 203 having a frequency higher than the IF signal. The frequency up-conversion is performed in two steps, utilizing one common circulator 106. The second LO signal coupled to the second LO terminal 203 has a higher frequency than the first LO signal. The resulting signal is a RF signal suitable for transmission by an antenna. Although the mixer circuit 301 comprises two LO terminals 103 and 203, two wave propagation media 105 and 205 and two switching means 107 and 207 a mixer circuit 301 with three or more of these components are possible.

The properties of the wave propagation medium 105 and 205, the circulator 106 and the switching means 107 and 207 are the same as referred to in the description of FIG. 1.

The circulator 106 couples together the first terminal 102, the first end 105a of the wave propagation medium 105, the first end 205a of the second wave propagation medium 205 and the second terminal 104. The switching means 107 is connected to the LO terminal 103 and is operable to open and close according to the voltage and/or the polarity of a signal coupled to the LO terminal 103. The signal coupled to the LO terminal 103 is generated by a LO generator 110, preferably producing either a sine wave or a square wave. Alternative suitable wave forms are of course also possible signals. The switching means 107 is further coupled to the second end 105b of the wave propagation medium 105 and to an electrical termination 108. The electrical termination 108 may be printed circuit board (PCB) vias coupled to a ground plane or other low impedance component coupled to the system's ground or alternatively to a DC voltage source (not shown).

The second switching means 207 is connected to the second LO terminal 203 and is operable to open and close according to the voltage and/or the polarity of a signal coupled to the second LO terminal 203. The signal coupled to the LO terminal 203 is generated by a LO generator 210, preferably producing either a sine wave or a square wave. Alternative suitable wave forms are of course also possible signals. The second switching means 207 is further coupled to the second end 205b of the wave propagation medium 205 and to an electrical termination 208. The electrical termination 208 may be printed circuit board (PCB) vias coupled to a ground plane or other low impedance component coupled to the system's ground or alternatively to a DC voltage source (not shown).

The signal coupled to the first terminal 102 is routed in the circulator 106 to the first end 105a of the wave propagation medium 105, the signal resulting from the reflection in the second end 105b of the wave propagation medium 105 is routed in the circulator 106 to the first end 205a of a second wave propagation medium 205 and the signal resulting from the reflection in the second end 205b of the wave propagation medium 205 is routed in the circulator 106 to the second terminal 104.

In FIG. 3, the first terminal 102 is coupled to an IF generator and the second terminal 104 is coupled to a filter 111 for rejecting unwanted frequencies. The filter may be any suitable microwave filter known in the art, for instance low-pass, high-pass or band-pass. The filter 111 is then connected to an antenna 112 suitable for transmitting the desired output RF signal.

The two switching means each preferably consists of a single switch, each coupled to the wave propagation medium 105 and 205 respectively. The single switch may be a semiconductor switch, for instance MOSFET, CMOS, GaAs or SiGe but may also be any other switch suitable for operation in the preferred frequency range.

Figure 4:
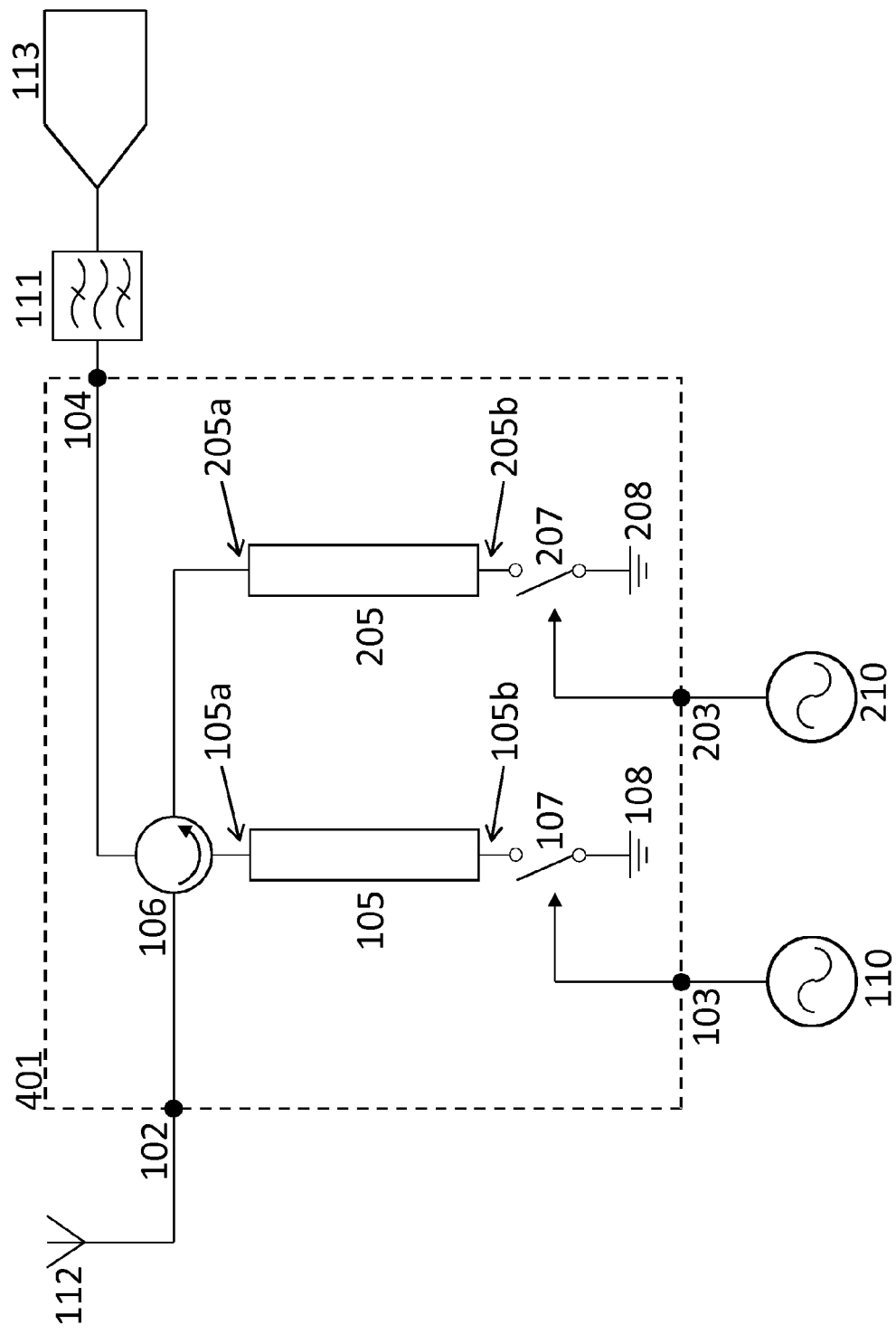
FIG. 4 is an illustration of a fourth embodiment of a mixer circuit according to the invention.

FIG. 4 schematically illustrates a mixer circuit 401 with an additional LO terminal 203, an additional wave propagation medium 205 and an additional switching means 207 compared to the mixer circuit 201. The function of the mixer circuit 401 is the same as the mixer circuit 201 shown in FIG. 2, i.e. it is used for down-converting a radio frequency signal by modulating it with LO signals coupled to the LO terminals 103, 203 with a frequency lower than the IF signal. The frequency down-conversion is performed in two steps, utilizing one common circulator 106. The second LO signal coupled to the second LO terminal has a lower frequency than the first LO signal coupled to the first LO terminal 103. The resulting signal is an IF signal suitable for processing by a receiver system. Although the mixer circuit 401 comprises two LO terminals 103 and 203, two wave propagation media 105 and 205 and two switching means 107 and 207 a mixer circuit 401 with three or more of these components are possible.

The properties of the wave propagation medium 105 and 205, the circulator 106 and the switching means 107 and 207 are the same as referred to in the description of FIG. 2.

The circulator 106 couples together the first terminal 102, the first end 105a of the wave propagation medium 105, the first end 205a of the second wave propagation medium 205 and the second terminal 104. The switching means 107 is connected to the LO terminal 103 and is operable to open and close according to the voltage and/or the polarity of a signal coupled to the LO terminal 103. The signal coupled to the LO terminal 103 is generated by a LO generator 110, preferably producing either a sine wave or a square wave. Alternative suitable wave forms are of course also possible signals. The switching means 107 is further coupled to the second end 105b of the wave propagation medium 105 and to an electrical termination 108. The electrical termination 108 may be printed circuit board (PCB) vias coupled to a ground plane or other low impedance component coupled to the system's ground or alternatively to a DC voltage source (not shown).

The second switching means 207 is connected to the second LO terminal 203 and is operable to open and close according to the voltage and/or the polarity of a signal coupled to the second LO terminal 203. The signal coupled to the LO terminal 203 is generated by a LO generator 210, preferably producing either a sine wave or a square wave. Alternative suitable wave forms are of course also possible signals. The second switching means 207 is further coupled to the second end 205b of the wave propagation medium 205 and to an electrical termination 208. The electrical termination 208 may be printed circuit board (PCB) vias coupled to a ground plane or other low impedance component coupled to the system's ground or alternatively to a DC voltage source (not shown).

The signal coupled to the first terminal 102 is routed in the circulator 106 to the first end of the wave propagation medium 105a, the signal resulting from the reflection in the second end 105b of the wave propagation medium 105 is routed in the circulator 106 to the first end 205a of a second wave propagation medium 205 and the signal resulting from the reflection in the second end 205b of the wave propagation medium 205 is routed in the circulator 106 to the second terminal 104.

In FIG. 4 the first terminal 102 is coupled to an antenna 112 for receiving RF signals. A filter (not shown) may be placed between the antenna 112 and the first terminal 102 for rejecting unwanted frequencies of the RF signal. The second terminal 104 is coupled to a filter 111 for rejecting unwanted frequencies. The filter 111 may be any suitable filter known in the art, for instance low-pass, high-pass or band-pass. The filter 111 is then connected to a analogue-to-digital converter 113 converting the analogue signal into a digital signal for further processing by the receiver system.

The two switching means each preferably consists of a single switch, each coupled to the wave propagation medium 105 and 205 respectively. The single switch may be a semiconductor switch, for instance MOSFET, CMOS, GaAs or SiGe but may also be any other switch suitable for operation in the preferred frequency range.

Figure 5:
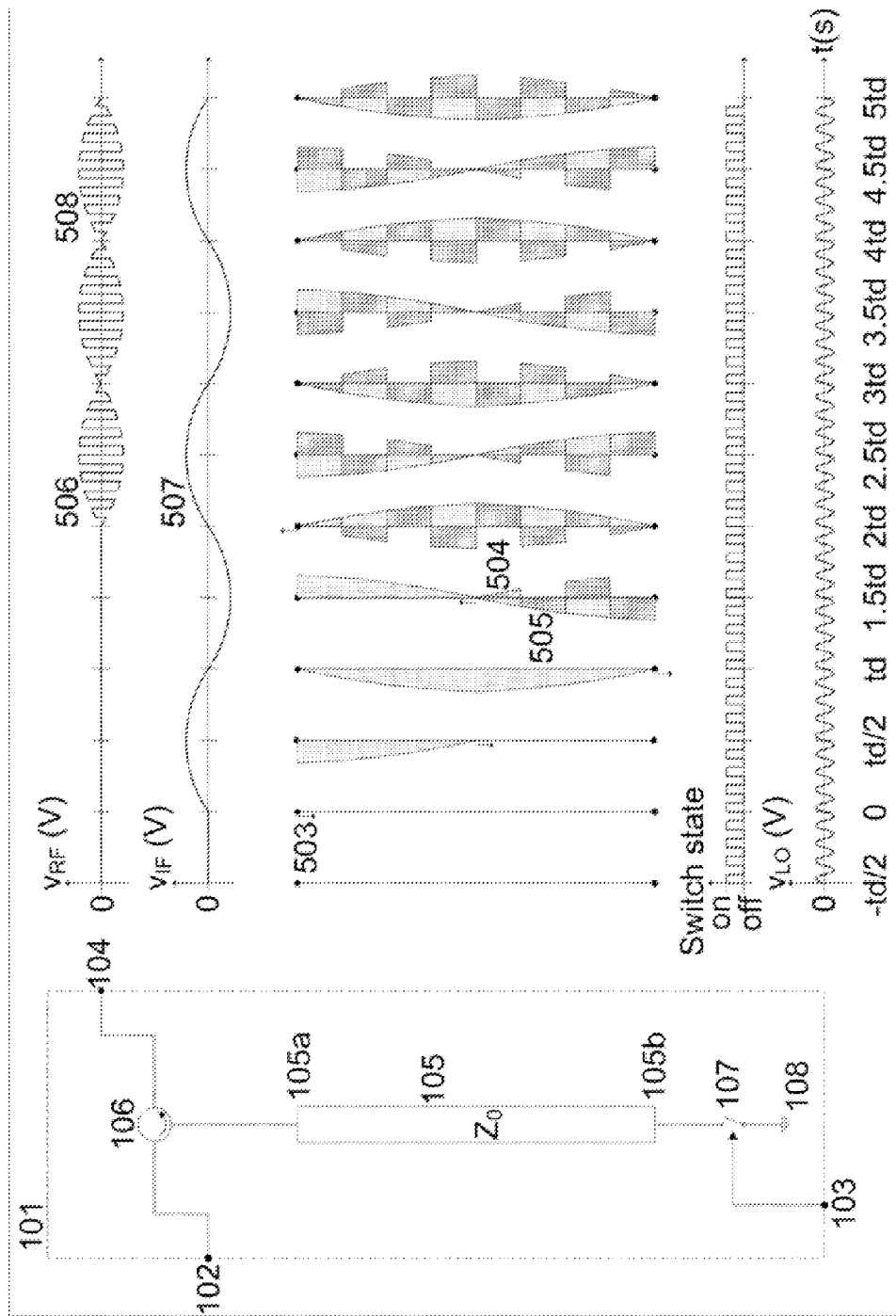
FIG. 5 schematically describes the time/voltage characteristic of the mixer circuit according to the first embodiment during up-conversion.

An operation cycle for a frequency up conversion circuit 101 is described with a time-space diagram in FIG. 5. It is also described in text below. The circuit is shown at start up, prior to connection of the IF signal to the first terminal 102, to clearly visualize the mixing function performed for the first time when the IF signal reaches the switching means 107.

The propagation time delay of the wave propagation medium 105 is denoted td(s). The LO and IF signal period times have been selected as integer multiples or fractions of td in this example, but may be of arbitrary lengths, as long as the wavelength of the input IF signal to the first terminal 102 is roughly the same or shorter than the electrical length of the wave propagation medium 105. The characteristic impedance of the wave propagation medium 105 is denoted $Z_0(\Omega)$ (typically 50Ω).

Voltage waves traveling in the wave propagation medium 105 towards the switching means 107 are marked with dotted areas. Voltage waves traveling in the wave propagation medium 105 towards the circulator 106 are marked with cross hatched areas. The zero voltage (0V) level along the wave propagation medium 105 is represented with a solid line, and the wave propagation medium end 105a, 105b positions are marked with large dots.

$t=-td/2$

The LO signal is continuously on and connected to the LO input terminal 103. The switching means 107 is in this example controlled by the LO signal to be in its closed state when the LO signal is positive, and in its open state when the LO signal is negative. There is no IF signal applied to the first terminal 102, and no RF signal is consequently outputted from the second terminal 104.

$t=0$

An IF signal is applied to the first terminal 102. The IF signal is routed in the circulator 106 into the first end 105a of the wave propagation medium 105. A voltage wave starts to propagate towards the switching means 107. The leading edge position and direction of travel along the wave propagation medium 105 is marked with a small arrow 503.

$t=td/2$

The IF signal has reached half ways into the wave propagation medium 105.

t=td

The IF signal has reached the second end 105b of the wave propagation medium 105. The switching means 107 will be in its on state until t=td+td/16. The IF signal will thus encounter a very low impedance (typically 1 mΩ) in the switching means 107 and the electrical termination 108, resulting in a reflection coefficient value Γ almost equal to −1.

Example; $\Gamma=(Z_L-Z_0)/(Z_L+Z_0)=(0.001-50)/(0.001+50)$
$=-0.99996$

The IF signal voltage wave will consequently be reflected in the second end 105b of the wave propagation medium 105 and maintain its shape, but having the inversed polarity 504.

At t=t+td/16 the switching means 107 will be turned off. The IF signal will now encounter a very high impedance in the switching means 107 (typically 1 MΩ), resulting in a reflection coefficient value Γ almost equal to +1.

Example; $\Gamma=(Z_L-Z_0)/(Z_L+Z_0)=(10^6-50)/(10^6+50)$
$=0.99990$

The IF signal voltage wave will consequently be reflected in the second end 105b of the wave propagation medium 105 and maintain its shape and original polarity 505.

The mixing function is in this manner performed by continuously alternating the single switch's state.

t=1.5 td

The RF signal has reached half ways into the wave propagation medium 105 in its way towards the circulator 106.

t=2 td

The RF signal has reached the circulator 106 where it is routed to the second terminal 104. A RF signal 506 will now be outputted from the mixer circuit 101. At the same time starts the second period 507 of the IF signal connected to the first terminal 102.

t=2.5 td

The output RF signal has reached its maximum amplitude.

t=3 td

The output RF signal has reached its minimum amplitude.

t=3.5 td

The output RF signal has reached its maximum amplitude a second time.

t=4 td

The output RF signal has reached its minimum amplitude a second time. The RF period is fulfilled and a new RF period 508 starts.

The above description of the operation cycle for a frequency up conversion is intended for illustrative purpose only and is in no way limiting. Different switching means operate with different values of the LO signal. The operation for the frequency down conversion works in a similar way. The use of one or more wave propagation mediums does not affect the function of the mixer circuit, instead the desired output RF signal is generated in one or more steps.

The invention claimed is:

1. A radio frequency mixer circuit comprising:
   a first terminal;
   a local oscillator (LO) terminal;
   a second terminal;
   a wave propagation medium having a first end and a second end and configured to carry a voltage wave from the first end to the second end;
   a circulator coupling together the first terminal, the first end of the wave propagation medium, and the second terminal; and
   a switch operable according to a signal coupled to the LO terminal, wherein the switch is coupled to the second end of the wave propagation medium to cause a reflection of the voltage wave, at the second end of the wave propagation medium, with unchanged voltage wave polarity when the switch is in an open state, or with inverted voltage wave polarity when the switch is in a closed state.

2. The radio frequency mixer circuit according to claim 1, further comprising:
   a second wave propagation medium with a first end and a second end and configured to carry another voltage wave from the first end to the second end, wherein the first end of the second wave propagation medium is coupled to the circulator;
   a second switch; and
   a second LO terminal, wherein the second switch is operable according to a second signal coupled to the second LO terminal and is coupled to the second end of the second wave propagation medium to cause a reflection of the another voltage wave, at the second end of the second voltage wave propagation medium, with the unchanged voltage wave polarity when the second switch is in the open state, or with the inverted voltage wave polarity when the second switch is in the closed state.

3. The radio frequency mixer circuit according to claim 1, wherein the second end of the wave propagation medium is coupled to ground when the switch is in the closed state.

4. The radio frequency mixer circuit according to claim 1, wherein the second end of the wave propagation medium is coupled to a DC voltage source when the switch is in the closed state.

5. The radio frequency mixer circuit according to claim 1, wherein the second end of the wave propagation medium is isolated from ground when the switch is in the open state.

6. The radio frequency mixer circuit according to claim 1, wherein the switch is a single semiconductor switch.

7. The radio frequency mixer circuit according to claim 1, wherein the first terminal is an input terminal for coupling an intermediate frequency (IF) signal and the second terminal is an output terminal for coupling a radio frequency (RF) signal.

8. The radio frequency mixer circuit according to claim 1, wherein the first terminal is an input terminal for coupling a radio frequency (RF) signal and the second terminal) is an output terminal for coupling an intermediate frequency (IF) signal.

9. The radio frequency mixer circuit according to claim 7, wherein the mixer circuit is operable for up-converting the signal coupled to the first terminal by modulating the signal coupled to the first terminal with the signal coupled to the LO terminal and where the frequency of the signal coupled to the LO terminal is greater than the frequency of the signal coupled to the first terminal.

10. The radio frequency mixer circuit according to claim 8, wherein the mixer circuit is operable for down-converting the signal coupled to the first terminal by modulating the signal coupled to the first terminal with the signal coupled to the LO terminal and where the frequency of the signal coupled to the LO terminal is lower than the frequency of the signal coupled to the first terminal.

11. The radio frequency mixer circuit according to claim 1, wherein the signal coupled to the first terminal is routed in the circulator to the first end of the wave propagation medium, and the signal resulting from the reflection in the second end of the wave propagation medium is routed in the circulator to the second terminal.

12. The radio frequency mixer circuit according to claim 1, wherein the signal coupled to the first terminal is routed in the circulator to the first end of the wave propagation medium, the signal resulting from the reflection in the second end of the wave propagation medium is routed to the first end of a second wave propagation medium, and the signal resulting from the reflection in the second end of the wave propagation medium is routed in the circulator to the second terminal.

13. The radio frequency mixer circuit according to claim 1, wherein the switch comprises a semiconductor switch, being one of MOSFET CMOS, GaAs or SiGe.

14. The radio frequency mixer circuit according to claim 1, wherein the wave propagation medium comprises at least one of a transmission line, a micro strip, a strip line, a printed circuit board track, a cable, lumped LC elements or a waveguide.

15. The radio frequency mixer circuit according to claim 1, wherein the circulator through which the electrical power travels, is comprised of any one of a magnetized material, a conductor near a magnetized material, a waveguide near a magnetized material, or electrical switches or other semiconductors to emulate corresponding circulator function.

16. The radio frequency mixer circuit according to claim 1, wherein the mixer circuit an electrical termination for the wave propagation medium, wherein the electrical termination electrically connects the second end of the wave propagation medium to a ground plane or to a DC voltage.

17. The radio frequency mixer circuit according to claim 1, wherein an electrical length of the wave propagation medium corresponds substantially to $\lambda_1$ or longer, where $\lambda_1$ is the wavelength of the signal into the first end of the wave propagation medium.

* * * * *

UNITED STATES PATENT AND TRADEMARK OFFICE
CERTIFICATE OF CORRECTION

PATENT NO.        : 8,829,973 B2                                           Page 1 of 1
APPLICATION NO.   : 13/877896
DATED             : September 9, 2014
INVENTOR(S)       : Sander It is certified that error appears in the above-identified patent and that said Letters Patent is hereby corrected as shown below:

On the Title Page, in item (51), under "Int. Cl.", in Column 1, Line 1, delete "H04B 1/44 (2006.01)" and insert -- H04B 1/44 (2006.01) H0P1 3/16 --, therefor.

In the Claims

In Column 10, Line 48, in Claim 8, delete "terminal)" and insert -- terminal --, therefor.

In Column 12, Line 8, in Claim 16, delete "circuit an" and insert -- circuit comprises an --, therefor.

Signed and Sealed this
Eighteenth Day of August, 2015

Michelle K. Lee
*Director of the United States Patent and Trademark Office*